United States Patent [19]

Shirn et al.

[11] 3,751,723

[45] Aug. 7, 1973

[54] HOT CARRIER METAL BASE TRANSISTOR HAVING A P-TYPE EMITTER AND AN N-TYPE COLLECTOR

[75] Inventors: George A. Shirn, Williamstown, Mass.; Norman Carlile Miller, Shaker Heights, Ohio; William L. Patterson, Williamstown, Mass.

[73] Assignee: Sprague Electric Company, North Adams, Mass.

[22] Filed: Mar. 1, 1972

[21] Appl. No.: 230,597

[52] U.S. Cl. .. 317/235 R, 317/234 R, 317/235 UA, 317/235 AQ

[51] Int. Cl. .......................... H01l 11/00, H01l 15/00

[58] Field of Search .......................... 317/234, 5, 5.2, 317/5.3, 235, 31, 48.4

[56] References Cited

UNITED STATES PATENTS

| | | | |
|---|---|---|---|
| 3,424,627 | 1/1969 | Michel et al. | 317/235 UA |
| 3,424,890 | 1/1969 | Ruyven | 317/235 UA |
| 3,439,290 | 4/1969 | Shinoda | 317/235 UA |
| 3,582,410 | 6/1971 | Lachapelle | 317/235 UA |

*Primary Examiner*—John W. Huckert
*Assistant Examiner*—Andrew J. James
*Attorney*—Vincent H. Sweeney et al.

[57] ABSTRACT

A p-type material comprising the emitter region of a metal base hot carrier transistor with n-type material comprising the collector to provide a p-metal-n hot carrier transistor. Hot holes injected through the emitter-base barrier give rise to hot electrons having sufficient energy to pass through the base-collector barrier.

1 Claim, 6 Drawing Figures

HOT CARRIER METAL BASE TRANSISTOR HAVING A P-TYPE EMITTER AND AN N-TYPE COLLECTOR

BACKGROUND OF THE INVENTION

This invention relates to metal base transistors of the hot electron transistor type and more particularly to a metal base hot-carrier transistor having an emitter of p-type conductivity.

Presently metal base n-m-n transistors are high frequency devices but present certain shortcomings in production.

It is an object of this invention to provide a metal base hot carrier transistor having improved characteristics.

It is another object of this invention to provide a p-type emitter-base hot carrier transistor which can be readily produced.

SUMMARY OF THE INVENTION

A metal base p-m-n hot carrier transistor which in a signal circuit diffuses hot holes from the p-type emitter region into the metal base. These holes give rise in the metal base to electrons which can cross the base-collector barrier which is between the metal and an n-type collector. The transistor is connected in the signal circuit to forward bias the emitter-base barrier and the collector region is positive with respect to the base.

DETAILED DESCRIPTION OF THE INVENTION

Figures 1, 2, 3, 4, 5, 6:
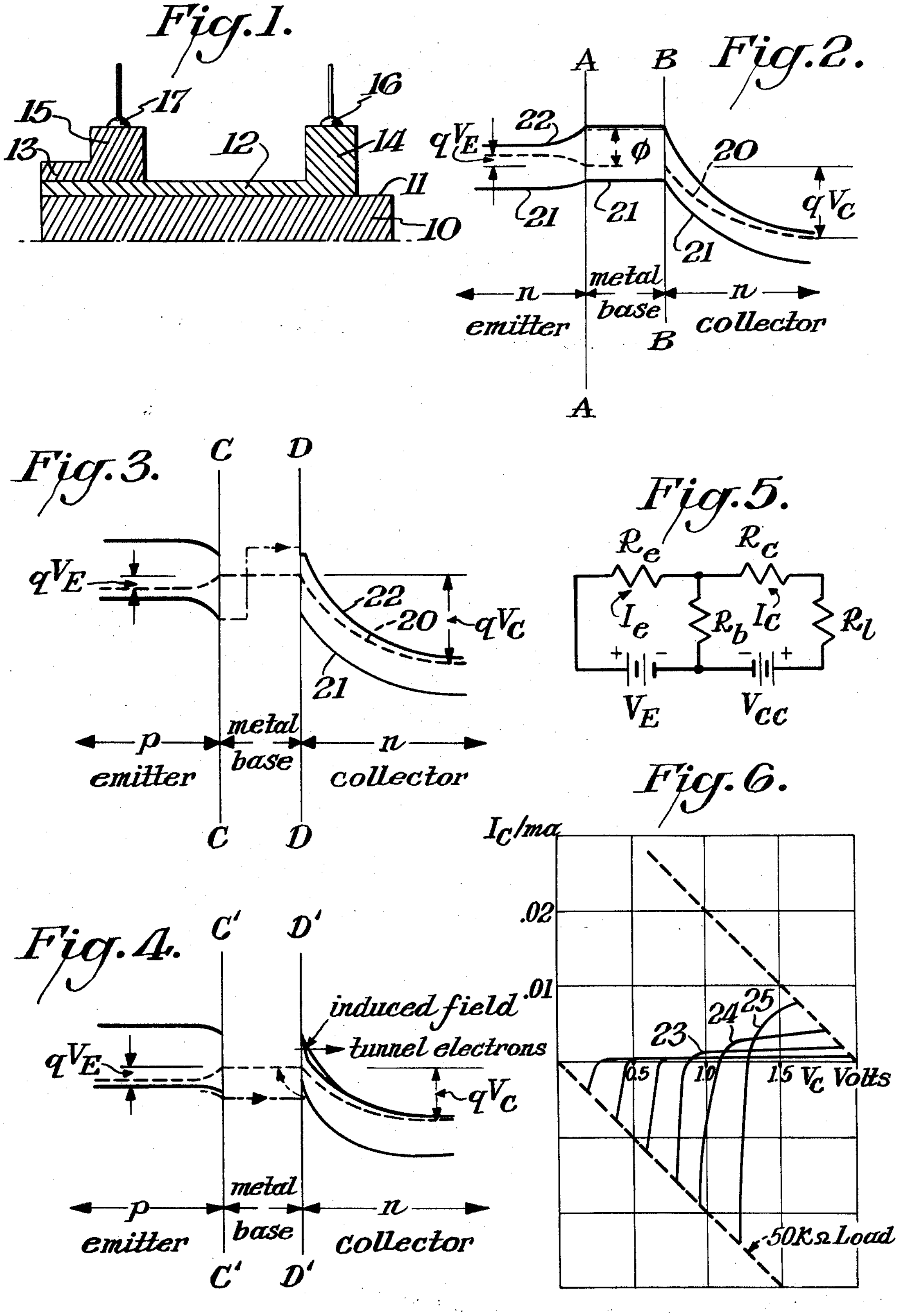
FIG. 1 is a diagrammatic view in section of a p-metal transistor device.
FIG. 2 is an energy level diagram of an n-metal-n transistor device.
FIGS. 3 and 4 are energy level diagrams of a p-metal-n transistor device.
FIG. 5 illustrates an equivalent circuit in which the base of the transistor is common to the input and output loops.
FIG. 6 illustrates several curves showing the current density vs. voltage characteristics of the transistor device provided in accordance with this invention.

FIG. 1 illustrates a device of this invention formed on a body of $n—n^+$epitaxial structure to provide a collector 10. On a major surface 11 on which is first epitaxially grown a layer of n-type silicon suitable for collector 10, a suitable molybdenum layer is deposited to provide metal base 12. It will be understood that molybdenum is referred to by way of illustration and is preferable because it does not alloy with silicon at temperatures ordinarily used in manufacture. Next a layer of P-type silicon is deposited over the base 12 to provide an emitter 13. As illustrated in FIG. 1 the base 12 and the emitter 13 are provided with pads 14 and 15 respectively. The pad 14 is provided with contact 16 and the pad 15 is provided with contact 17.

In a specific example, a process for producing the transistor of this invention may use a starting material formed of suitable body of single crystal <111> silicon of 0.01 ohm/cm n-type silicon with an epitaxial layer formed thereon with about 3 microns of about 1 ohm/cm n-type silicon in standard epitaxy equipment. A collector 10 thus provided has a major surface 11. On the surface 11 there is provided the base 12 by sputtering molybdenum through a mask under suitable conditions, such as, for example, a target voltage of 1,500, pressure 1.5 $\mu$ argon. The mask is movable 1.6 mm/hr. target current 1.2 ma and the substrate temperature 300° C. Deposited under these conditions a molybdenum base 12 deposited on the collector surface 11 is highly oriented, and about 90 angstroms thick. The mask motion across the collector surface is stopped but the deposition continued at the end of the layer so as to build up a thick area of the molybdenum base pad 14. The particular resistivity of the collector 10 is that which provides rectifying contact with the molybdenum base 12.

Next the mask is returned across the collector surface and deposited molybdenum layer to the end of base 12 opposite the built-up pad 14. Silicon is sputtered through the mask on top of the molybdenum base 12. The mask is again moved across the surface to form the emitter 13 and stopping short of the molybdenum pad 14. The silicon deposition is continued with the mask stationary to build up a thick area for an emitter pad 15. Suitable silicon sputtering conditions similar to those noted above for molybdenum are established with a silicon target of, for example, 1 ⅛ inch diameter by ⅛ inch thickness and of <100> p-type 0.01 ohm/cm silicon.

The desired shape of the p-metal-n transistor device is then defined by etching into a strip using standard masking and etching techniques. The strip is 0.003 inch wide by 0.030 inch long incorporating the base 12, base pad 14, emitter 13, emitter pad 15 and a section of the collector 10.

FIG. 2 is a plot depicting an energy level diagram for an n-metal-n hot electron transistor in which energy level is plotted as ordinate against distance as abscissa. Dash line 20 indicates the Fermi level, $E_f$, solid line 21 represents the top of the valence band, solid line 22 represents the bottom of the conduction band. In FIG. 2, the emitter material is n-type conductivity, the base is metal and the collector is n-type conductivity. The emitter barrier is indicated by A—A. Electrons can diffuse over the forward biased emitter barrier A—A. These electrons are at an energy several kT above the Fermi level, $E_f$, in the metal as indicated by $\phi$. After diffusing across the metal base the electrons are collected by the collector field, as the hot electrons have sufficient energy to pass through the base-collector barrier B—B.

The energy diagram shown in FIG. 3 depicts a device in which the emitter material is a p-type semiconductor. The emitter-base barrier is indicated as C—C. Instead of electrons, holes diffuse across the emitter-base barrier C-C into the metal of the base. In the base the holes are below the Fermi level. The hole energy is transferred to electron energy above the Fermi level and the action of the electrons thus produced is similar to that of the device described in connection with FIG. 2. The electrons have sufficient energy to pass through the base-collector barrier D—D.

One explanation for the energy transfer from hole-to-electron is that of an electron-hole-phonon interaction of the type described in J.M. Ziman, "Electrons and Phonons," Oxford Univ. Press. 1960, London. It is related to the metal composition.

The energy diagram shown in FIG. 4 also depicts the p-metal-n hot electron transistor. Hot holes from the p-type emitter penetrate into the collector a small distance as determined by the energy of the holes and the retarding field. A certain number of holes being in the collector region at all times, a space charge is produced in the collector near the metal-collector interface. The holes penetrate until, their kinetic energy being converted to potential energy, the collecting field in the collector region returns the holes to the base.

However, the steady state condition maintains sufficient positive space charge so that the potential near the barrier $D^1$—$^{D1}$ is pulled down enough to allow thermal electrons in the metal base to tunnel across the barrier $D^1$—$^{D1}$. Thus the steady state positive space charge provides a collector depletion layer for receiving tunnel electrons from the metal base.

The effect of the hot holes transfer is illustrated by the results achieved with the circuit shown in FIG. 5 and the curves of FIG. 6. The strip device of FIG. 1 described above was connected in a common base connection as shown by the equivalent circuit of FIG. 5. The collector current density and voltage are plotted respectively as the ordinate and the abscissa of the graph of FIG. 6.

The curves 23, 24 and 25 show that an increase in collector current with emitter drive can be obtained. The merit of this invention can be seen from the results shown by the curves 23, 24 and 25. The current density clearly cannot be obtained with a passive network. It may be said, therefore, application of this invention enables transistor action.

In the device of FIG. 1 the materials may be those suitable for a hot electron device such as thin aluminum for the metal base and semiconductive silicon or germanium for the emitter and collector. The device has high frequency capabilities. Also the p-type emitter provides advantageous production possibilities in comparison with the n-m-n device.

What is claimed is:

1. A metal base hot hole device consisting essentially of a p-type silicon emitter layer having a sputtered structure on the surface of a thin molybdenum layer base having a highly oriented single crystal structure on a $n—n^+$ epitaxial body as a collector having an epitaxial structure to form metal-semiconductor junctions between the emitter and the base and the body as the collector, and circuit means for biasing the emitter-base junction in a forward direction, the holes in the emitter, the thickness of the metal layer and the potential in the circuit means cooperating to cause holes to move across the junction of the p-type sputtered silicon emitter with the highly oriented thin molybdenum base, and the base and the collector being connected to cause the holes under kinetic energy in the molybdenum to undergo energy transfer from hole-to-electron, the electrons in the base being hot, and under the said base-collector connection penetrating and crossing the base-collector junction.

* * * * *